(12) United States Patent
Takasugi et al.

(10) Patent No.: US 8,154,483 B2
(45) Date of Patent: Apr. 10, 2012

(54) IMAGE DISPLAY APPARATUS AND DRIVING METHOD THEREOF

(75) Inventors: Shinji Takasugi, Yamato (JP); Osamu Tokuhiro, Yamato (JP); Kaoru Kusafuka, Kanagawa (JP); Yutaka Kuba, Yamato (JP)

(73) Assignee: LG Display Co., Ltd., Seoul (KR)

( * ) Notice: Subject to any disclaimer, the term of this patent is extended or adjusted under 35 U.S.C. 154(b) by 936 days.

(21) Appl. No.: 12/085,527

(22) PCT Filed: Nov. 17, 2006

(86) PCT No.: PCT/JP2006/323036
§ 371 (c)(1),
(2), (4) Date: Jun. 17, 2008

(87) PCT Pub. No.: WO2007/060898
PCT Pub. Date: May 31, 2007

(65) Prior Publication Data
US 2009/0284511 A1      Nov. 19, 2009

(30) Foreign Application Priority Data
Nov. 28, 2005  (JP) .................................. 2005-342541

(51) Int. Cl.
*G09G 3/30*  (2006.01)
(52) U.S. Cl. ...................................... 345/78; 315/169.3
(58) Field of Classification Search ............. 345/76–83, 345/211–213; 315/169.3
See application file for complete search history.

(56) References Cited

U.S. PATENT DOCUMENTS

| 7,173,590 B2 * | 2/2007 | Uchino et al. | 345/92 |
| 7,502,000 B2 * | 3/2009 | Yuki et al. | 345/77 |

FOREIGN PATENT DOCUMENTS

| JP | 2003-330418 A | 11/2003 |
| JP | 2004-302211 A | 10/2004 |
| JP | 2005-258427 A | 9/2005 |

OTHER PUBLICATIONS

R. M. A. Dawson et al., Design of an Improved Pixel for a Polysilicon Active-Matrix Organic LED Display, SID 98 Digest 11-14.
S. Ono et al., Pixel Circuit for a-Si AM-OLED, IDW 2003, pp. 255-258.

* cited by examiner

*Primary Examiner* — Amr Awad
*Assistant Examiner* — Aaron Midkiff
(74) *Attorney, Agent, or Firm* — Birch, Stewart, Kolasch & Birch, LLP

(57) ABSTRACT

Disclosed is an image display wherein luminance change due to change of the light-emitting device over time is compensated while suppressing affects of characteristics change in the drive transistor. Specifically disclosed is an image display comprising a plurality of pixels, wherein each pixel has a light-emitting device (OLED) which emits light when current is passed therethrough, a driver device (Td) for controlling light emission of the light-emitting device, and a control circuit (A) which is electrically connected to the light-emitting device and the driver device, and directly or indirectly detects the voltage applied to the light-emitting device at least during when the light-emitting device is emitting light and reflects the detection results to the driver device.

11 Claims, 11 Drawing Sheets

$$W_{21} < W_{Td} , W_{Tth} , W_{Ts} , W_{Tm}$$

$$W_{25} < W_{Td} , W_{Tth} , W_{Ts} , W_{Tm}$$

$$Cadd < Cs$$

$W_{21} < W_{Td}, W_{Tth}, W_{Ts}, W_{Tm}$ $W_{25} < W_{Td}, W_{Tth}, W_{Ts}, W_{Tm}$ $Cadd < Cs$

IMAGE DISPLAY APPARATUS AND DRIVING METHOD THEREOF

TECHNICAL FIELD

The present invention relates to an image display apparatus such as an organic EL display apparatus, and the driving method thereof.

RELATED ART

Conventionally, an image display apparatus with an organic EL (Electronic Luminescence) element which has the function of emitting light by recombination of holes and electrons injected into a light-emitting layer has been proposed.

In this type of image display apparatus, each pixel includes thin film transistor ("TFT") having amorphous silicon, polycrystalline silicon, etc. and an organic light-emitting diode ("OLED") which is an example of an organic EL element. The luminance of each pixel is controlled by setting the current through each pixel to an appropriate value.

An active matrix type image display apparatus includes a plurality of pixels, each of which has a current driving type light emitting element such as an OLED and a driving transistor such as a TFT for controlling a current through the OLED in series. In this type of image display apparatus, the current value through the light emitting element may change because of the fluctuation of the threshold voltage of the driving transistor in each pixel, and luminance nonuniformity may occur. One technique for reducing this nonuniformity, is the driving method for detecting the threshold voltage of the driving transistor, and then controlling the current through the light emitting element on a basis of the detected threshold voltage, as disclosed in R. M. A. Dawson, et al. (1998). Design of an Improved Pixel for a Polysilicon Active-Matrix Organic LED Display. SID 98 Digest, pp. 11-14. A circuit structure for carrying out such a driving method is disclosed in S. Ono, et al. (2003). Pixel Circuit for a-Si AM-OLED. Proceedings of IDW '03, pp. 255-258.

It is known that in addition to the fluctuation of the threshold voltage of the driving transistor, the OLED also deteriorates over time. The current density and the luminance of the OLED decrease over time according to the applied voltage to the OLED. A technique for coping with this phenomenon, is discussed in Japanese Unexamined Patent Application Publication No. 2003-330418 which discloses a display apparatus and the driving method thereof which can compensate the luminance change due to the characteristics change over time with a simple circuit structure not having a light conductive element.

SUMMARY OF THE INVENTION

However, the technique disclosed in Japanese Unexamined Patent Application Publication No. 2003-330418 does not perform the act of detecting the current or the voltage in the circuit which includes the light emitting element such as the OLED, and the act of compensating the luminance change of the light emitting elements in a pixel. Therefore, there is a problem that an external circuit can have a more complicated structure and a larger size.

An object of the present invention is to compensate the luminance change of the light emitting elements due to the characteristics change of the light emitting elements over time with the simple external circuit.

According to one aspect of the invention, an image display apparatus includes a plurality of pixels. Each of the pixels includes a light emitting element operable to emit light while a current passes through the light emitting element. Each pixel also includes a driver configured to control light emission of the light emitting element. The driver is electrically connected to the light emitting element. Each pixel further includes a control circuit electrically connected to the light emitting element and the driver. The control circuit directly or indirectly detects a voltage applied to the light emitting element to reflect the detection results to the driver at least while the light emitting element is emitting light.

According to another aspect of the invention, a method of driving an image display apparatus comprising a light emitting element and a driver configured to control the light emission of the light emitting element includes: detecting a voltage applied to the light emitting element at least while the light emitting element is emitting light; and applying a voltage to the driver at least while the light emitting element is emitting light. The applied voltage to the driver corresponds to the detected voltage.

According to another aspect of the invention, since the luminance change due to the characteristic change of the light emitting element of each pixel can be small the external circuit can be maintained with a simple structure while compensating the luminance change of the light emitting elements.

DETAILED DESCRIPTION OF THE INVENTION

Hereinafter, exemplary embodiments of image display apparatuses and driving methods thereof according to the present invention are described in detail with the reference to the figures. It should be understood that the invention is not limited to the embodiments.

Figure 1:
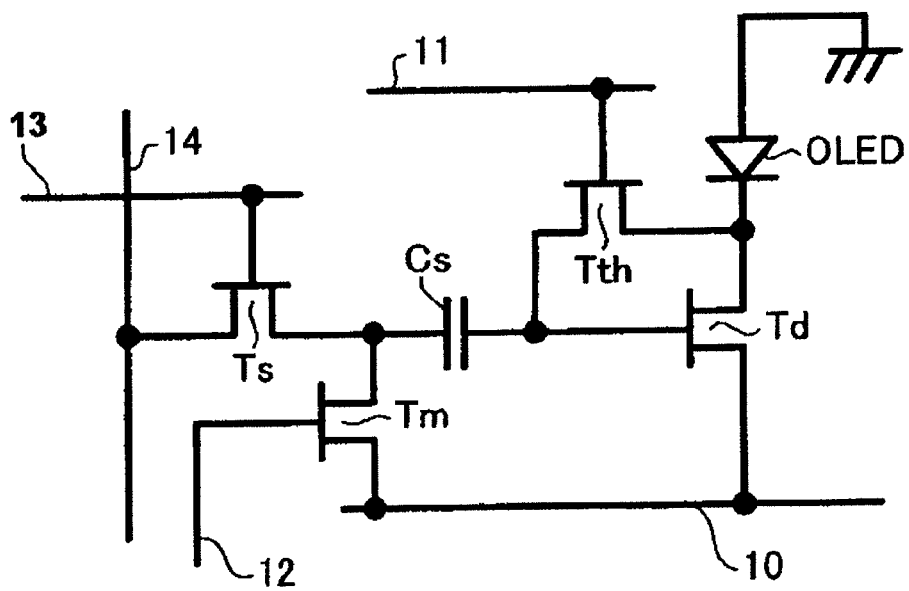
FIG. 1 is a diagram for explaining an image display apparatus in accordance with one embodiment of the invention and shows an exemplary pixel circuit corresponding to one pixel of the image display apparatus.

FIG. 1 is a diagram for explaining an image display apparatus in accordance with one embodiment of the invention and shows an exemplary pixel circuit corresponding to one pixel in the image display apparatus. The pixel circuit shown in FIG. 1 includes an organic light emitting element OLED which is one of the light emitting elements, a driving transistor $T_d$ which is a driver for driving the organic light emitting element OLED, a threshold voltage detecting transistor $T_{th}$, a storage capacitor $C_s$, a switching transistor $T_s$, and a switching transistor $T_m$. The structure shown in FIG. 1 is a general pixel circuit for controlling the organic light emitting element etc. and does not show the feature of the invention. This image display apparatus includes a plurality of pixels arranged in a matrix.

In FIG. 1, the driving transistor $T_d$ is the controller (driver) for controlling the current through the organic light emitting element OLED on a basis of the potential difference between its gate terminal and its source terminal.

The threshold voltage detecting transistor $T_{th}$, when it is on, electrically connects the gate and the drain of the driving transistor $T_d$. As a result, the current from the gate of the driving transistor $T_d$ flows to the drain of the driving transistor $T_d$ until the potential difference between the gate and the source of the driving transistor $T_d$ substantially reaches the threshold voltage $V_{th}$ of the driving transistor $T_d$, and then the threshold voltage $V_{th}$ of the driving transistor $T_d$ is detected.

The organic light emitting element OLED has a characteristic that the current flows through the organic light emitting element OLED by applying a potential difference larger than the threshold voltage of the organic light emitting element to the anode and the cathode of the organic light emitting element OLED, and thereby emits light. Specifically, the organic light emitting element OLED includes an anode layer having Al, Cu, or ITO (Indium Tin Oxide), a cathode layer, and a light emitting layer between the anode and cathode layers. The light emitting layer includes an organic material such as Phthalocyanine, tris-(8-hydroxyquinoline)aluminum, benzoquinoline, beryllium. The organic light emitting element OLED has a function of emitting light by recombination of electrons and holes injected into the light emitting layer.

The driving transistor $T_d$, the threshold voltage detecting transistor $T_{th}$, the switching transistor Ts and the switching transistor Tm may be TFTs. In each figure referred below, the channel type (p-type or n-type) of each TFT is not shown. Each of the TFTs may be either p-type or n-type. In this embodiment, all TFTs are n-type. Each of the TFTs may include any one of amorphous silicon, microcrystalline silicon, and polycrystalline silicon.

A power source line 10 supplies various pre-determined voltages to the driving transistor $T_d$ and the switching transistor $T_m$. A control line 11 supplies a signal for controlling drive of the threshold voltage detecting transistor $T_{th}$ to the transistor $T_{th}$. A merge line 12 supplies a signal for controlling drive of the switching transistor $T_m$ to the transistor $T_m$. A scanning line 13 supplies a control signal for driving the switching transistor Ts. An image signal line 14 supplies an image signal to the storage capacitor $C_s$.

In FIG. 1, a ground line is arranged on the anode side of the organic light emitting element OLED and the power source line 10 is arranged on the cathode side of the organic light emitting element OLED. Alternatively, the power source line 10 may be arranged on the anode side and the ground line may be arranged on the cathode side. The power source line 10 may be arranged on both of the anode and the cathode sides of the organic light emitting element OLED.

Figure 2:
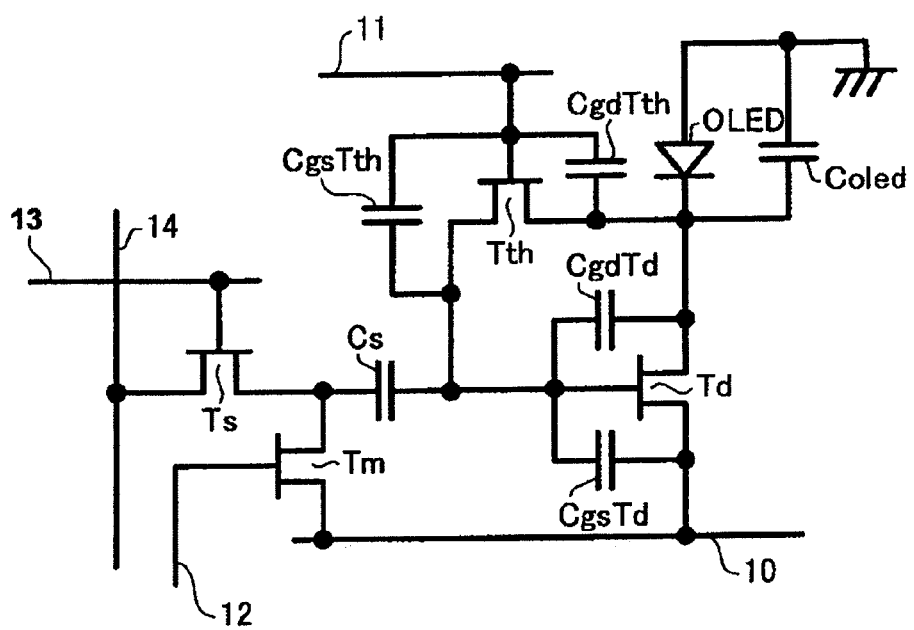
FIG. 2 shows parasitic capacities of transistor and an organic light emitting element capacitor on the pixel circuit shown in FIG. 1.

Generally, transistors have parasitic capacitors between the gate and the source and between the gate and the drain. In this embodiment, the following four parasitic capacitors mainly affect the gate potential of the driving transistor $T_d$: a first capacitor $C_{gsTd}$ between the gate and the source of the driving transistor $T_d$, a second capacitor $C_{gdTd}$ between the gate and the drain of the driving transistor Td, a third capacitor $C_{gsTth}$ between the gate and the source of the threshold voltage detecting transistor $T_{th}$, and a fourth capacitor $C_{gdTth}$ between the gate and the drain of the threshold voltage detecting transistor $T_{th}$. FIG. 2 shows an image pixel circuit including the above-described parasitic capacitors and including an organic light emitting element capacitor $C_{oled}$ which the organic light emitting element inherently has.

Figure 3:
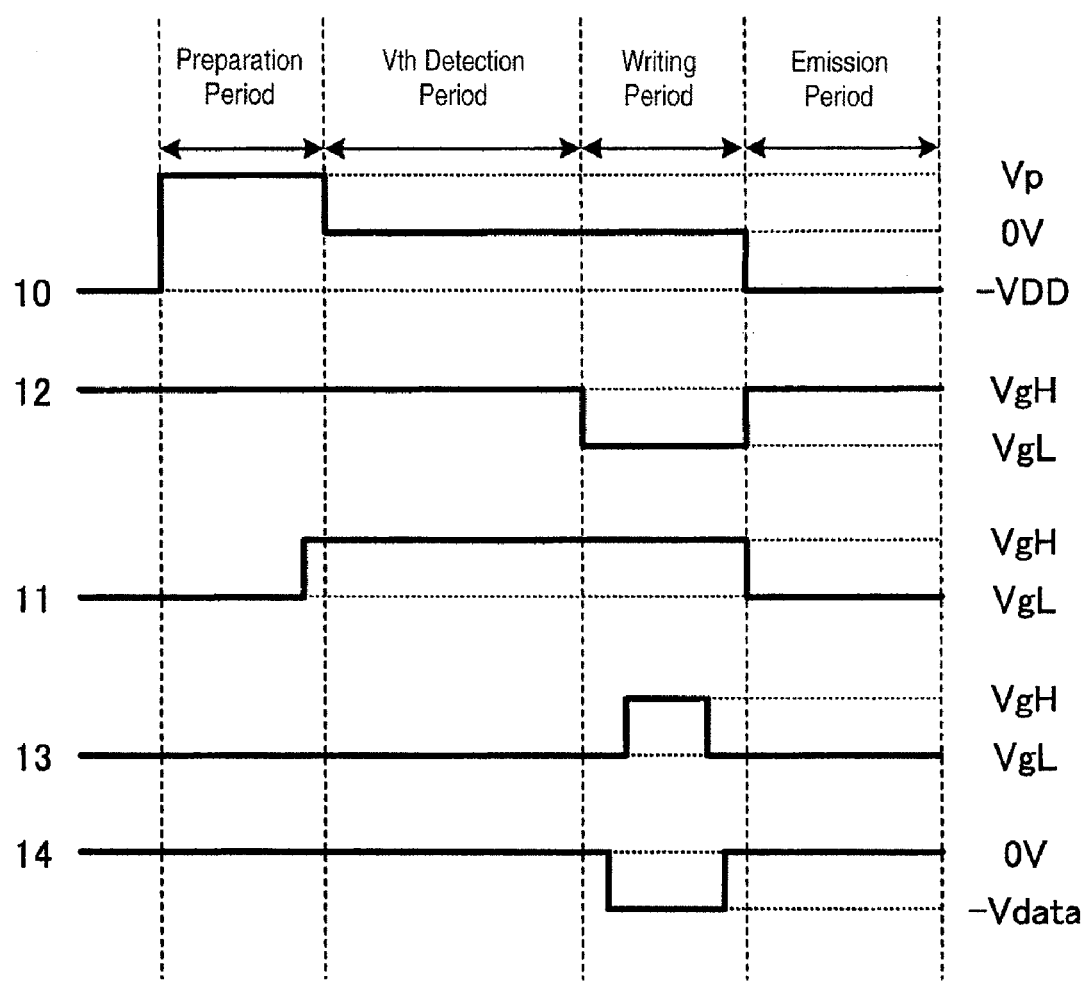
FIG. 3 is a sequence diagram showing general operations of the pixel circuit shown in FIG. 2.
Figure 5:
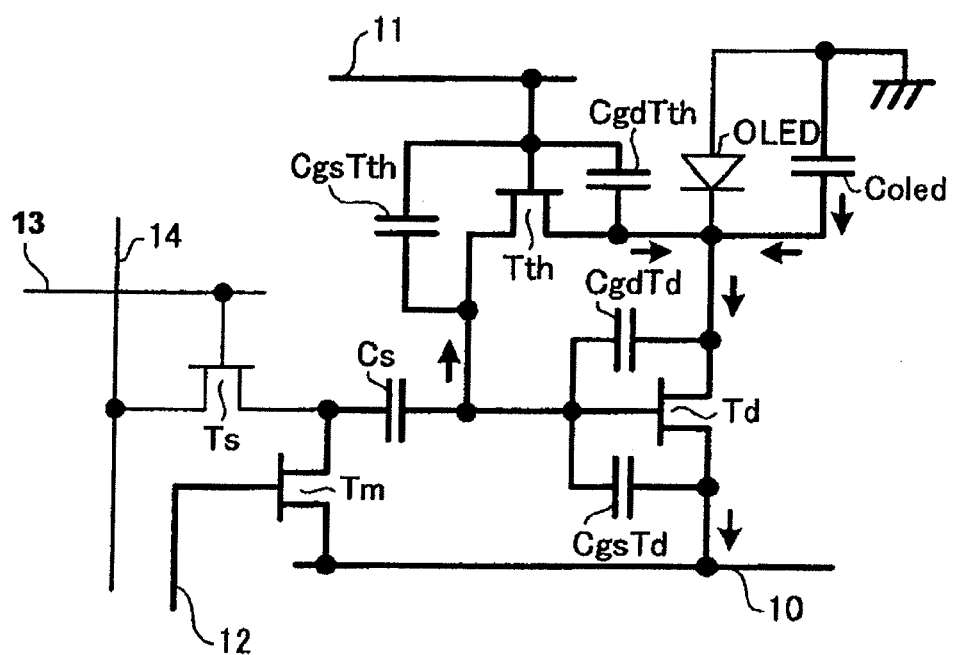
FIG. 5 is a diagram showing an operation in a threshold voltage detection period shown in FIG. 3.
Figure 6:
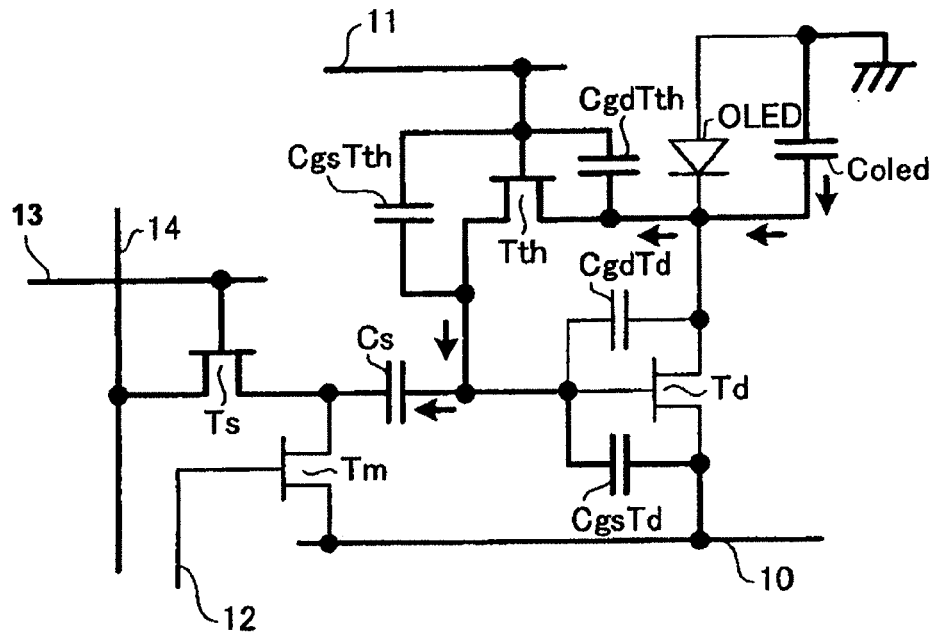
FIG. 6 is a diagram showing an operation in a writing period shown in FIG. 3.
Figure 7:
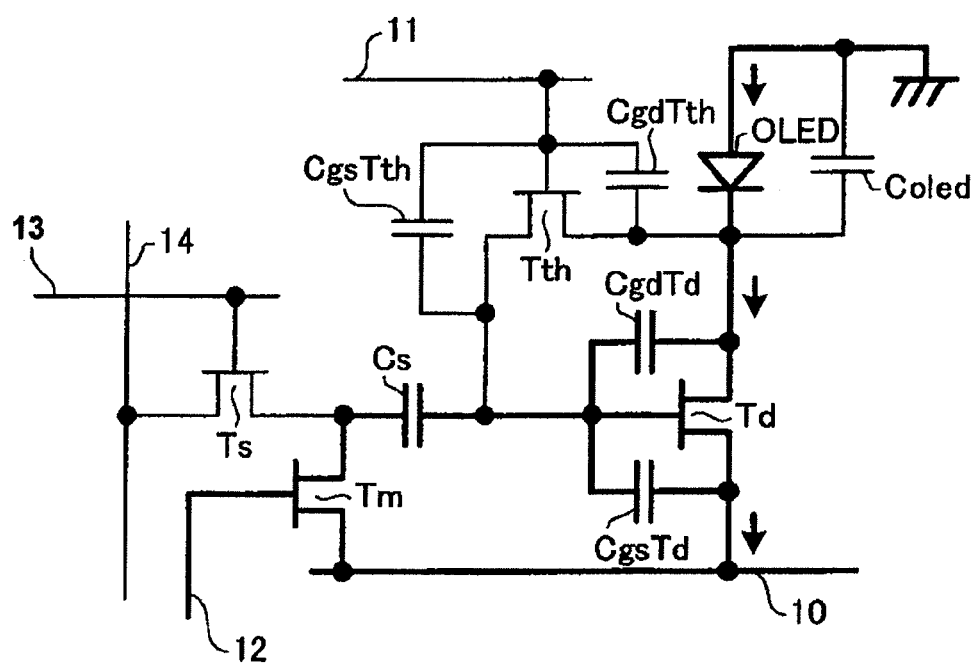
FIG. 7 is a diagram showing an operation in a light emission period shown in FIG. 3.

Next, the operations of this embodiment are explained with reference to FIGS. 3 to 7. FIG. 3 is a sequence diagram showing general operations of the pixel circuit shown in FIG. 2. FIGS. 4 to 7 are diagrams showing the operation in each frame, which is divided into the following four periods: the preparation period (FIG. 4), the threshold voltage detection period (FIG. 5), the writing period (FIG. 6) and the emission period (FIG. 7). The operations described below are controlled by a control unit (not shown in the Figures).

(The Preparation Period)

Figure 4:
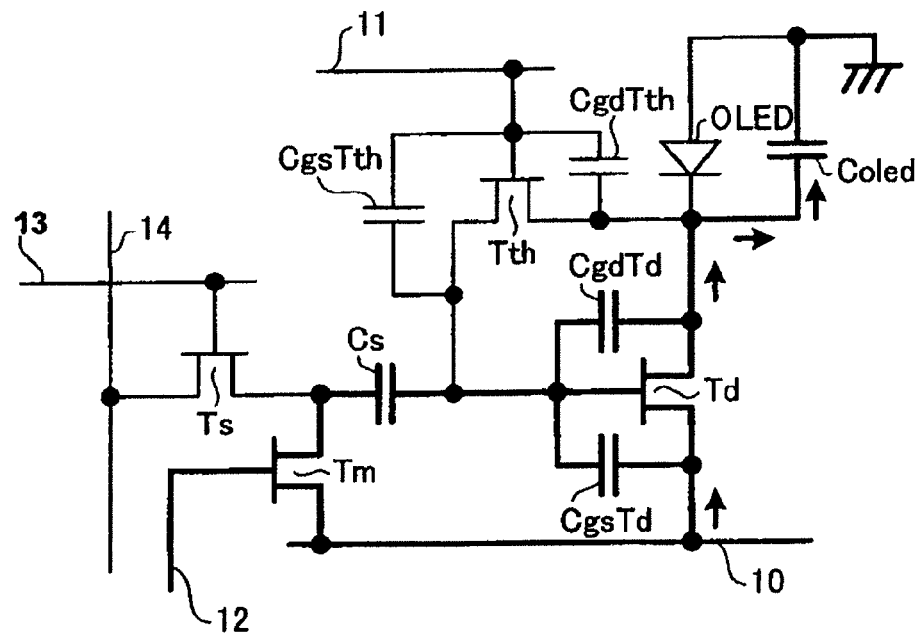
FIG. 4 is a diagram showing an operation in a preparation period shown in FIG. 3.

The operation in the preparation period is explained with reference to FIGS. 3 and 4. In the preparation period, the power source line 10 is set to the preparation potential ($V_p$), the merge line 12 is set to the high gate potential ($V_{gH}$), the $T_{th}$ control line 11 is set to the low gate potential ($V_{gL}$), and the image signal line 14 is set to zero. This state, as shown in FIG. 4, turns off the threshold voltage detecting transistor $T_{th}$, turns off the first switching transistor $T_s$, turns on the driving transistor $T_d$ and turns on the second switching transistor $T_m$. As a result, the current flows from power source line 10 to the organic light emitting element capacitor $C_{oled}$ through the driving transistor $T_d$, and thereby the organic light emitting element capacitor $C_{oled}$ stores an electric charge, in order for the organic light emitting element capacitor $C_{oled}$ to be used as a supply source of the current flowing between the drain and the source of the driving transistor $T_d$ while the threshold voltage between the gate and the source of the driving transistor is being detected. When the threshold voltage between the gate and the source of the driving transistor $T_d$, a current between the drain and the source of the driving transistor $T_d$ (hereinafter, the current is referred as an "$I_{ds}$") substantially does not flow in the threshold voltage detection period.

(The Threshold Voltage Detection Period)

Next, the operation in the threshold voltage detection period is explained with reference to FIGS. 3 and 5. In the threshold voltage detection period, the power source line 10 is set to zero, the merge line 12 is set to the high gate potential ($V_{gH}$), the $T_{th}$ control line 11 is set to the high gate potential ($V_{gH}$), the scanning line 13 is set to the low gate potential ($V_{gL}$) and the image signal line 14 is set to zero. This state turns on the threshold voltage detecting transistor $T_{th}$ as shown in FIG. 5. As a result, the gate and the drain of the driving transistor $T_d$ are electrically connected.

The electric charges stored in the storage capacitors $C_s$ and the organic light emitting element capacitor $C_{oled}$ are discharged and current flows from the driving transistor Td to the power source line 10. When the potential difference between the gate and the source of the driving transistor $T_d$ substantially reaches the threshold voltage $V_{th}$, the driving transistor $T_d$ is substantially turned off and the threshold voltage $V_{th}$ of the driving transistor Td is detected.

(The Writing Period)

The operation in the writing period is explained with reference to FIGS. 3 and 6. In the writing period, a data potential ($-V_{data}$) is supplied to the storage capacitor $C_s$, and thereby the gate of the driving transistor $T_d$ is set to the data potential. Specifically, the power source line 10 is set to zero, the merge line 12 is set to the low gate potential ($V_{gL}$), the $T_{th}$ control line 11 is set to the high gate potential ($V_{gH}$), the scanning line 13 is set to the high gate potential ($V_{gH}$), and the image signal line 14 is set to the data potential ($-V_{data}$).

This operation turns on the first switching transistor $T_s$ and turns off the second switching transistor $T_m$, and then the electric charge stored in the organic light emitting element capacitor $C_{oled}$ is discharged. Therefore, current flows from the organic light emitting element capacitor $C_{oled}$ to the storage capacitor $C_s$ through the threshold voltage detecting transistor $T_{th}$ and the storage capacitor $C_s$ stores the electric charge. In other words, the electric charge stored in the organic light emitting element moves to the storage capacitor $C_s$. As a result, the gate of the driving transistor $T_d$ is set to a potential corresponding to the data potential.

Here, $V_{th}$ represents the threshold voltage of the driving transistor $T_d$, $C_s$ represents the capacitance value of the storage capacitor, and $C_{all}$ represents the sum of the capacitance values connected to the gate of the driving transistor Td while the threshold voltage detecting transistor $T_{th}$ is on. The gate potential $V_g$ of the driving transistor Td is represented by the following equation (1). Note that the above representation applies to the following equations.

$$V_g = V_{th} - (C_s/C_{all}) \cdot V_{data} \tag{1}$$

The potential difference $V_{Cs}$ between both ends of the storage capacitor $C_s$ is represented by the following equation (2).

$$V_{Cs} = V_g - (-V_{data}) = V_{th} + [(C_{all} - C_s)/C_{all}] \cdot V_{data} \tag{2}$$

In the equation (2), '$C_{all}$' is represented by the following equation.

$$C_{all} = C_{oled} + C_s + C_{gsTth} + C_{gdTth} + C_{gsTd} \tag{3}$$

Equation (3) does not include the second capacitor $C_{gdTd}$ between the gate and the drain of the driving transistor $T_d$. This is because the gate and the drain of the driving transistor $T_d$ are connected through the threshold voltage detecting transistor $T_{th}$ and because both the gate and the drain have substantially the same potential. The capacitance value relation between the storage capacitor $C_s$ and the organic light emitting element capacitor $C_{oled}$ is set to be $C_s < C_{oled}$.

(The Emission Period)

Finally, the operation in the light emission period is explained with reference to FIGS. 3 and 7. In the light emission period, the power source line 10 is set to the negative potential ($-V_{DD}$), the merge line 12 is set to the high gate potential ($V_{gH}$), the $T_{th}$ control line 11 is set to the low gate potential ($V_{gL}$), the scanning line 13 is set to the low gate potential ($V_{gL}$) and the image signal line 14 is set to zero.

Consequently, as shown in FIG. 7, the operation turns on the driving transistor $T_d$, turns off the threshold voltage detecting transistor $T_{th}$ and turns off the first switching transistor Ts. Then, the current flows from the organic light emitting element OLED to the power source line 10 through the driving transistor $T_d$, and thereby the organic light emitting element OLED emits light.

Here, the current $I_{ds}$ flowing from the drain of the driving transistor $T_d$ to the source of the driving transistor Td is represented by the following equation 4. The equation has the constant β whose value is determined by the structure and material of the driving transistor $T_d$, the potential difference $V_{gs}$ between the gate and the source of the driving transistor Td, and the threshold voltage $V_{th}$ of the driving transistor.

$$I_{ds} = (\beta/2) \cdot (V_{gs} - V_{th})^2 \tag{4}$$

Next, in order to consider the relation between the potential difference $V_{gs}$ of the driving transistor $T_d$ and the current Ids, the potential difference $V_{gs}$ is calculated under the assumption that the pixel circuit has no parasitic capacitors.

In FIG. 7, the driving transistor Td is on during the emission period. The data potential ($-V_{data}$) partially influences the voltage of the storage capacitor $C_s$ and that of the organic light emitting element capacitor $C_{oled}$. Therefore, the gate to source potential difference $V_{gs}$ is represented by the following equation.

$$V_{gs} = V_{th} + C_{oled}/(C_s + C_{oled}) \cdot V_{data} \tag{5}$$

Thus, the equation for showing the relation between the potential difference $V_{gs}$ between the gate and the source of the driving transistor Td and the current Ids is represented by the following equation derived from the equations (4) and (5).

$$I_{ds} = (\beta/2) \cdot (C_{oled}/(C_s + C_{oled}) \cdot V_{data})^2 \tag{6}$$
$$= a \cdot V_{data}^2$$

As shown in the equation (6), theoretically, detecting the threshold voltage of the transistor $T_d$ can make the current $I_{ds}$ independent of the threshold voltage $V_{th}$.

The above-described pixel circuit compensates the characteristics change of the driving transistor Td and the influence of the parasitic capacitors which any transistor inherently has. However, the organic light emitting element OLED deteriorates as well as the driving transistor does over time. Both of the current density for the applied voltage to the organic light emitting element OLED and the luminance for the current density of the organic light emitting element OLED deteriorate according to the driving time of the organic light emitting element OLED.

Figure 8:
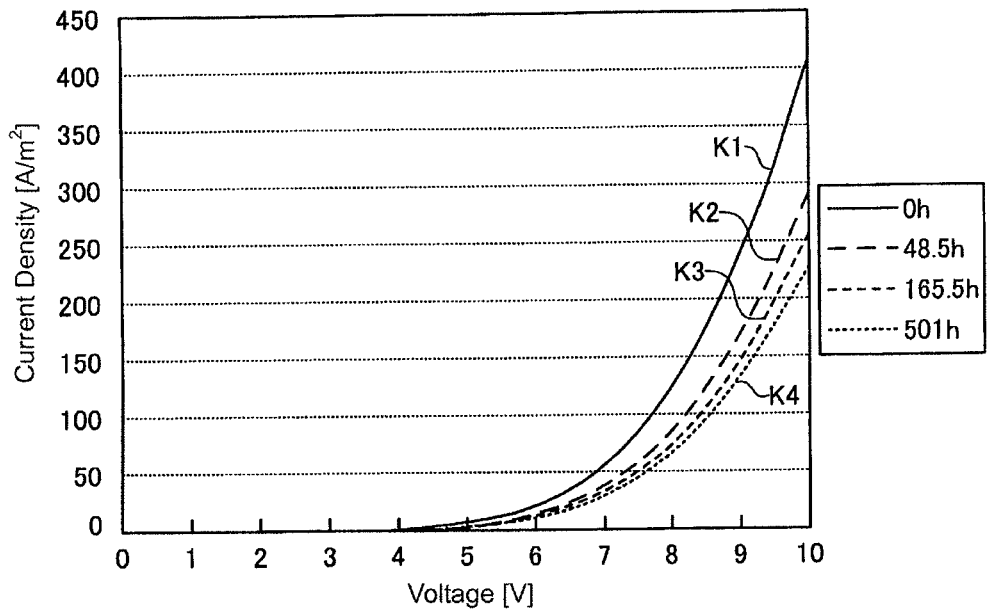
FIG. 8 is a diagram showing an exemplary relationship between the applied voltage to the organic light emitting element OLED and the current density in the organic light emitting element OLED.

FIG. 8 is an exemplary diagram showing a relationship between the applied voltage to the organic light emitting element OLED and the current density of the organic light emitting element OLED. The graphs in the FIG. 8 show the result of a continuous light emitting test for the organic light emitting element OLED. In the FIG. 8, the solid line K1 represents the characteristics at the beginning phase where the OLED driving time is 0 hour, the long dashed line K2 represents the characteristics after 48.5 hours of OLED driving time, the short dashed line K3 represents the characteristics after 165.5 hours of OLED driving time, and the dotted line K4 represents the characteristics after 501 hours of OLED driving time. Unlike the characteristics of the light emitting element in the FIGS. 2 and 7 etc. of Japanese Unexamined Patent Application Publication No. 2003-330418, the characteristics shown in FIG. 8 do not include the deterioration of transistors such as the driving transistor $T_d$.

FIG. 8 clearly shows that the longer the driving time of the organic light emitting element OLED is, the smaller the current density to the applied voltage becomes. FIG. 8 also shows that keeping the same level of current density requires an increased applied voltage to the organic light emitting element OLED in accordance with the length of the OLED driving time.

Figure 9:
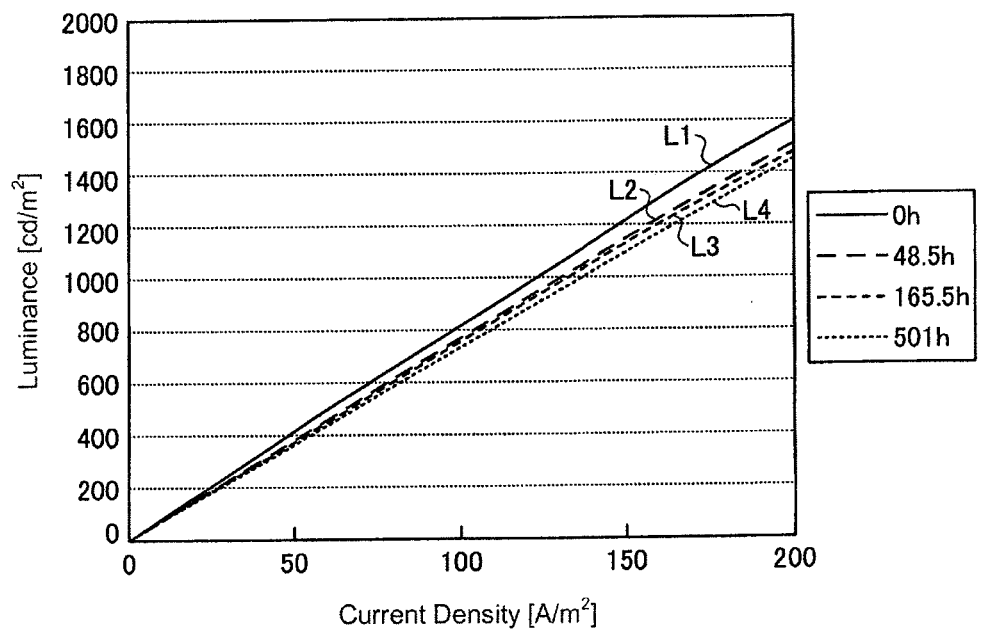
FIG. 9 is a diagram showing an exemplary relationship between the current density in organic light emitting element OLED and the luminance of the organic light emitting element OLED.

FIG. 9 is a diagram showing an exemplary relationship between the current density and the luminance of the organic light emitting element OLED. The graphs in the FIG. 9 show the continuous light emitting test as in FIG. 8. The solid line L1 represents the characteristics at the beginning phase where the OLED driving time is 0 hour, the long dashed line L2 represents the characteristics after 48.5 hours of OLED driving time, the short dashed line L3 represents the characteristics after 165.5 hours of OLED driving time, and the dotted line L4 represents the characteristics after 501 hours of OLED driving time.

Like in FIG. 8, the characteristics shown in FIG. 9 do not include the deterioration of transistors such as the driving transistor Td. FIG. 9 shows that the longer the driving time of the organic light emitting element OLED is, the smaller the luminance to the current density of the organic light emitting element OLED becomes. FIG. 8 also shows that keeping the same level of luminance requires increased current density of the organic light emitting element OLED in accordance with the length of the OLED driving time.

Figure 10:
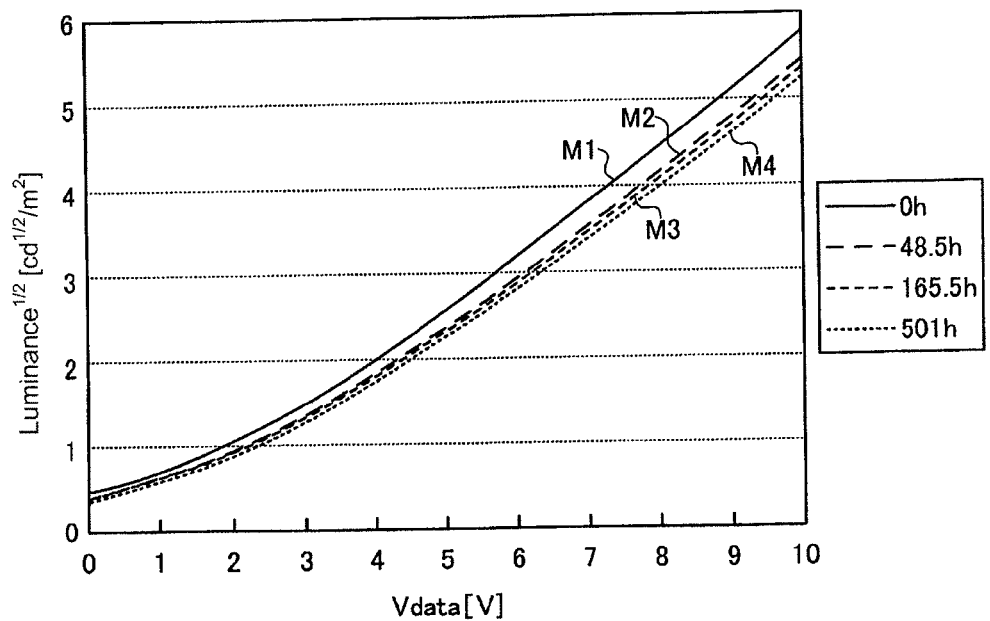
FIG. 10 is a diagram showing an exemplary relationship between the applied voltage (image signal potential) to the gate of the driving transistor Td for controlling the organic light emitting element OLED and the luminance of the organic light emitting element OLED.

FIG. 10 is a diagram showing an exemplary relationship between the applied voltage to the gate of the driving transistor Td for controlling the organic light emitting element OLED and the square root of the luminance of the organic light emitting element OLED. FIG. 10 shows the continuous light emitting test as in FIGS. 8 and 9. The solid line M1 represents the characteristics in the beginning phase where the OLED driving time is 0 hour, the long dashed line M2 represents the characteristics after 48.5 hours of OLED driving time, the short dashed line M3 represents the characteristics after 165.5 hours of OLED driving time, and the dotted line M4 represents the characteristics after 501 hours of OLED driving time. In the above-described pixel circuit, the potential to be directly controlled is the gate of the driving transistor Td for driving the organic light emitting element OLED, which is supplied with the image signal potential. Therefore, it is necessary to know the fluctuation characteristics shown in FIG. 10.

FIG. 10 shows similar characteristics to the characteristics in FIGS. 8 and 9. It is found that even if the image signal potential $V_{data}$ is written with the threshold voltage $V_{th}$ to the gate of the driving transistor $T_d$, the luminance decreases according to the length of the driving time of the light emitting. It is also found that the same level of the luminance requires an increased applied voltage to the driving transistor $T_d$ in accordance with the driving time.

The technique shown in Japanese Unexamined Patent Application Publication No. 2003-330418 does not feed back the detected voltage or the detected current in the same frame during which the detected voltage or the detected current is obtained (hereinafter, referred to a 'detecting frame'). The technique in Japanese Unexamined Patent Application Publication No. 2003-330418 feeds back the detected voltage or the detected current in the next frame after the detected frame in the earliest case. Therefore, this conventional technique cannot compensate adequately when the luminance completely changes before and after one frame. Here, a 'frame' means a period during which a sequence of processes for rewriting an image displayed in the image display apparatus are performed in cycle. For example, in a display driven at the 60 Hz frequency, one frame period is 16.67 ms.

On the other hand, a technique according to one embodiment described below, the pixel circuit itself detects the applied voltage to the organic light emitting element OLED, and then feeds back a voltage corresponding to the detected voltage, to the driving transistor $T_d$ in the same frame as the detecting frame. The principle is explained below.

Figure 11:
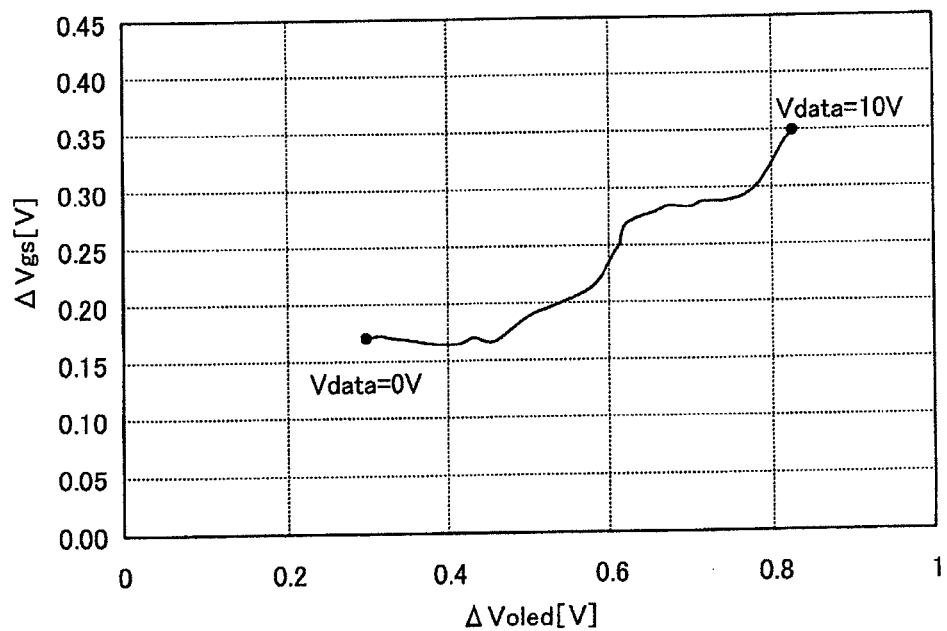
FIG. 11 is a characteristic diagram showing the relationship between the '$\Delta V_{oled}$' after 501 hours and '$\Delta V_{gs}$' after 501 hours at the test like the test in FIGS. 8 to 10.

'$\Delta V_{oled}$' represents the difference between the initial voltage $V_{oled}$ of the organic light emitting element OLED at the light emission and the voltage of the organic light emitting element OLED after the organic light emitting element OLED is driven for a certain period. '$\Delta V_{gs}$' represents the value of $V_{gs}$, which is necessary value for increasing the luminance of the organic light emitting element OLED which has been driven for the certain period to the initial luminance value of the organic light emitting element OLED. FIG. 11 is a characteristic diagram showing the relationship between the '$\Delta V_{oled}$' after 501 hours and '$\Delta V_{gs}$' after 501 hours at the continuous light emitting test like the above-described tests. FIG. 11 shows that both '$\Delta V_{oled}$' and '$\Delta V_{gs}$' depend on the image signal voltage $V_{data}$.

Figure 12:
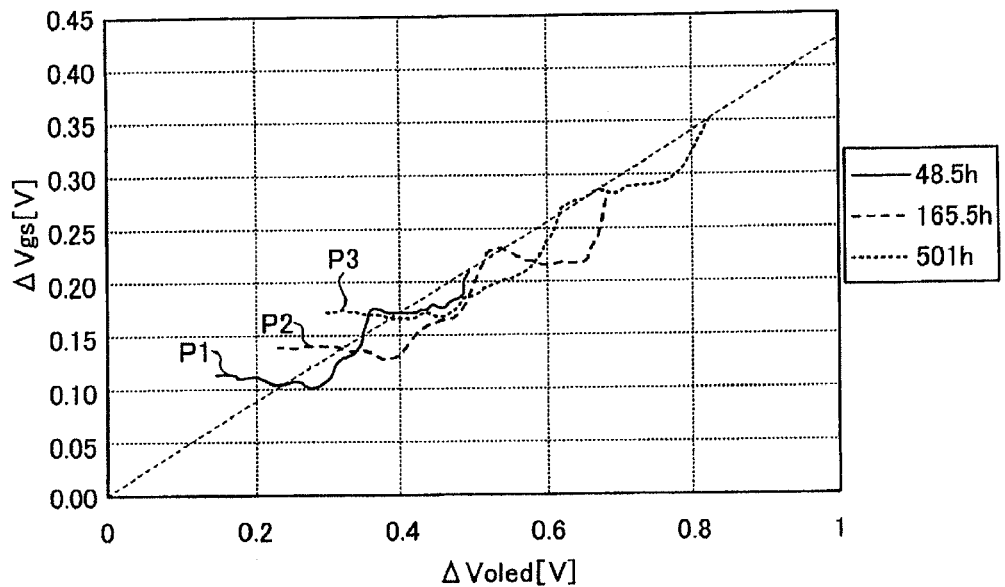
FIG. 12 is a diagram superimposing a solid line P1 which is a characteristic curve of the driven organic light emitting element OLED for 48.5 hours and a dashed line P2 which is a characteristic curve of the driven organic light emitting element OLED for 165.5 hours on a shorter dashed line P3 which is a characteristic diagram in FIG. 11.

FIG. 12 is a diagram superimposing the following three lines: the solid line P1 is the characteristics curve of the organic light emitting element OLED driven for 48.5 hours, the dashed line P2 is the characteristics curve of the organic light emitting element OLED driven for 165.5 hours, and the dotted line P3 is the characteristics curve in FIG. 11. FIG. 12 additionally shows the straight line having a gradient (in an example of FIG. 12, the gradient is 0.43). It was found that the characteristics curves of '$\Delta V_{gs}$' to '$\Delta V_{oled}$' at each of driving times of the organic light emitting element OLED align along a straight line having a certain gradient.

Accordingly, adding a voltage proportional to the '$\Delta V_{oled}$' of the organic light emitting element OLED (the proportional constant in FIG. 12: 0.43) to the $V_{gs}$ of the driving transistor $T_d$ enables it to compensate for the deterioration of the luminance of the organic light emitting element at all gradation levels.

Figure 13:
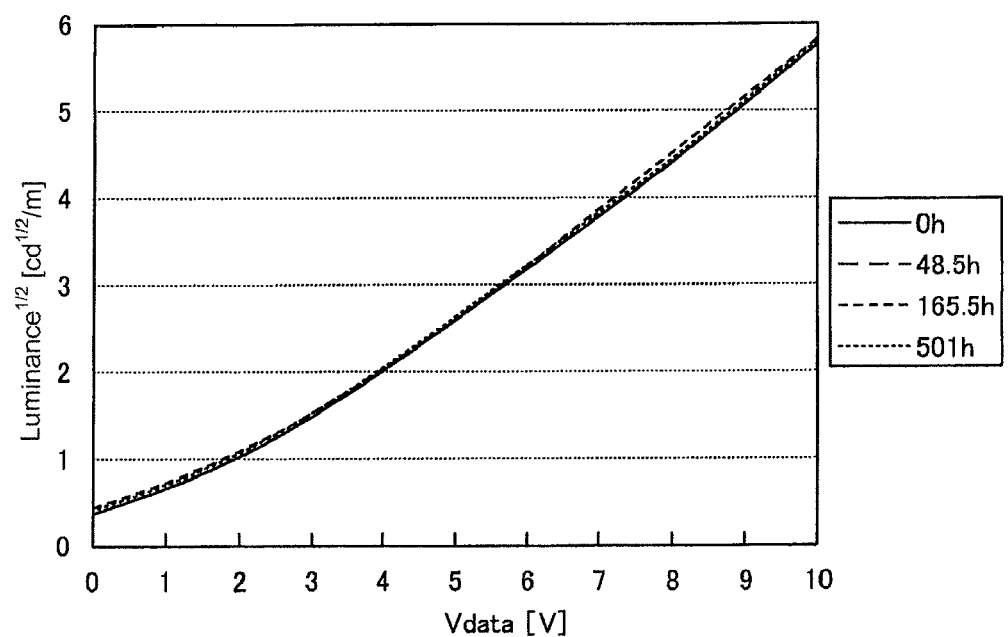
FIG. 13 is a diagram showing a characteristic after compensation on a basis of the technique in accordance with one embodiment of the invention, which is a characteristic of luminance of the organic light emitting element OLED to the image signal potential applied to the gate of the driving transistor Td.

FIG. 13 is a diagram showing a characteristic after compensation on a basis of the above-described technique. As understood by comparing with FIG. 10 showing the characteristics before the compensation, the luminance change depending on the driving time of the organic light emitting element can be reduced.

Next, the method of adding the voltage is explained. At the actual control, in view of the ease of control, it is preferable to add the proportional voltage to '$V_{oled}$' rather than to '$\Delta V_{oled}$'. Of course, adding the proportional voltage to '$\Delta V_{oled}$' is also available.

$V_{oled0}$ represents the initial value of the voltage of the organic light emitting element OLED and $V_{gs}'$ represents the voltage of the gate to the source of the driving transistor Td after compensation. The $V_{gs}'$ can be represented by the following equation by using the proportional constant 'b' which is a gradient of the straight line on the above-described characteristics curves.

$$V'_{gs} = V_{gs} + \Delta V_{gs} \quad (7)$$
$$= V_{gs} + b \cdot \Delta V_{oled}$$
$$= V_{gs} + b \cdot (V_{oled} - V_{oled0})$$

Now, d is substituted for $C_{oled}/(C_s + C_{oled})$ in the equation (5) and then the resulting equation (5) is substituted for the equation (7), and thereby the applied voltage $V_{gs}'$ after compensation can be represented by the following equation.

$$V'_{gs} = V_{th} + d \cdot V_{data} + b \cdot (V_{oled} - V_{oled0}) \quad (8)$$
$$= V_{gs} + (d \cdot V_{data} - b \cdot V_{oled0}) + b \cdot V_{oled}$$

In the equation (8), $b \cdot V_{oled0}$ does not depend on the OLED characteristics change over time and is determined by a value of $V_{data}$, while $V_{oled}$ depends on the OLED characteristics change over time. Accordingly, taking $b \cdot V_{oled0}$ into consideration allows to compensate the luminance change of the organic light emitting element OLED on a basis of the equation (8). Note that $b \cdot V_{oled0}$ is a constant value determined by the OLED characteristics. Therefore, in the case that an image signal potential ($-V_{data}$) is written to the storage capacitor $C_s$ in the pixel circuit shown in FIG. 1, if the written image signal potential ($-V_{data}$) stored in the storage capacitor $C_s$ is reduced in advance by a predetermined voltage corresponding to $b \cdot V_{oled0}$, it is not necessary to store the initial characteristics of the organic light emitting element OLED. It is not necessary either to store other initial constants even when such constants exist.

Figure 14:
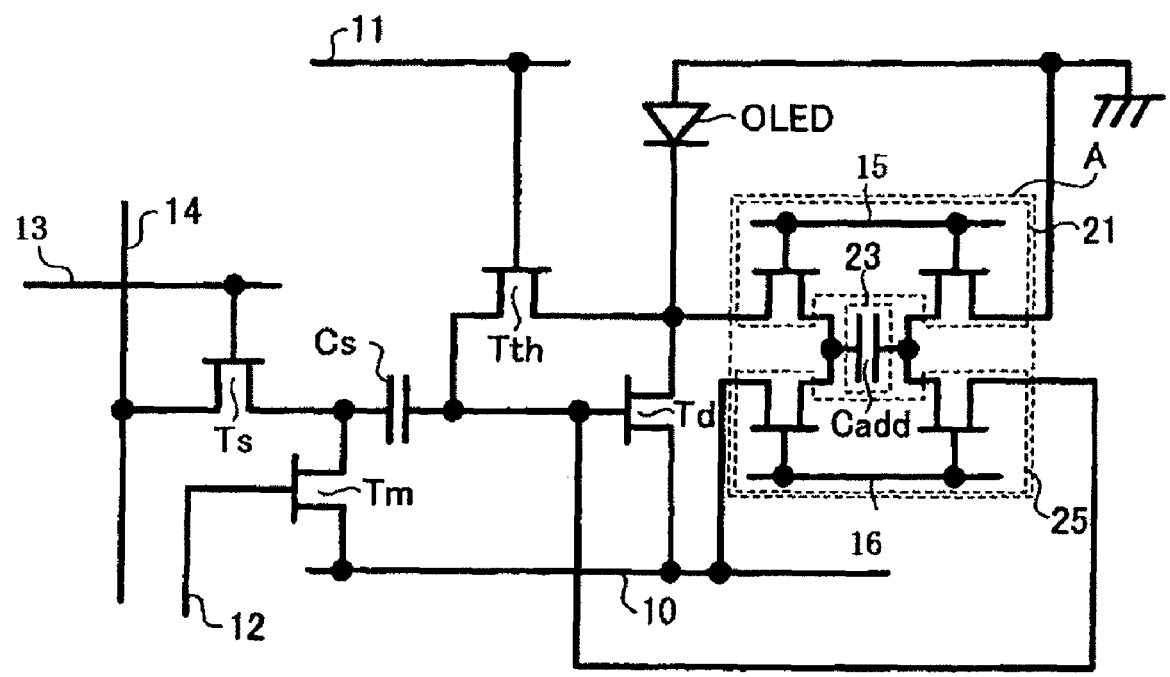
FIG. 14 is a diagram showing an exemplary pixel circuit where the compensation technique in accordance with one embodiment of the invention is applied to the pixel circuit in FIG. 1.

FIG. 14 is a diagram showing an exemplary structure in a case that the above-described technique applies to the pixel circuit shown in FIG. 1. The pixel circuit shown in FIG. 14 includes a control circuit A. The control circuit A includes a detecting circuit 21 as a detecting unit, for detecting a voltage applied to both ends of the organic light emitting element OLED, a voltage storage circuit 23 as a voltage storage unit, for storing the detected voltage by the detecting circuit 21, and a feedback circuit 25 as a feedback unit, for applying the stored voltage in the voltage storage circuit 23 between the gate and the source of the driving transistor Td. Each pixel includes the control circuit A. Note that in FIG. 14, the parasitic capacitors in the transistor constituting the control circuit A are not shown.

In FIG. 14, the voltage storage circuit 23 includes the additional capacitor $C_{add}$ which stores the detected voltage. The detecting circuit 21 may include, for example, a pair of transistors connected to each other through the voltage storage circuit 23. Each gate of the transistors can be commonly connected to the first $V_{oled}$ control line 15 as a first control line. A first end of the detecting circuit 21 (for example, drain or source of one transistor) may be connected to the cathode of the organic light emitting element OLED and a second end of the detecting circuit 21 (for example, drain or source of the other transistor) may be connected to the anode of the organic light emitting element OLED.

The feedback circuit 25 may include a similar structure as the detecting circuit 21. The feedback circuit 23 may include, for example, a pair of transistors connected to each other through the voltage storage circuit 23. Each gate of the transistors can be commonly connected to a second $V_{oled}$ control line 16 as a second control line. A first end of the feedback circuit 25 (for example, drain or source of one transistor) may be connected to the first terminal (gate) of the driving transistor $T_d$ and a second end of the feedback circuit 25 (for example, drain or source of the other transistor) may be connected to the second terminal (source or drain) of the driving transistor $T_d$.

Figure 15:
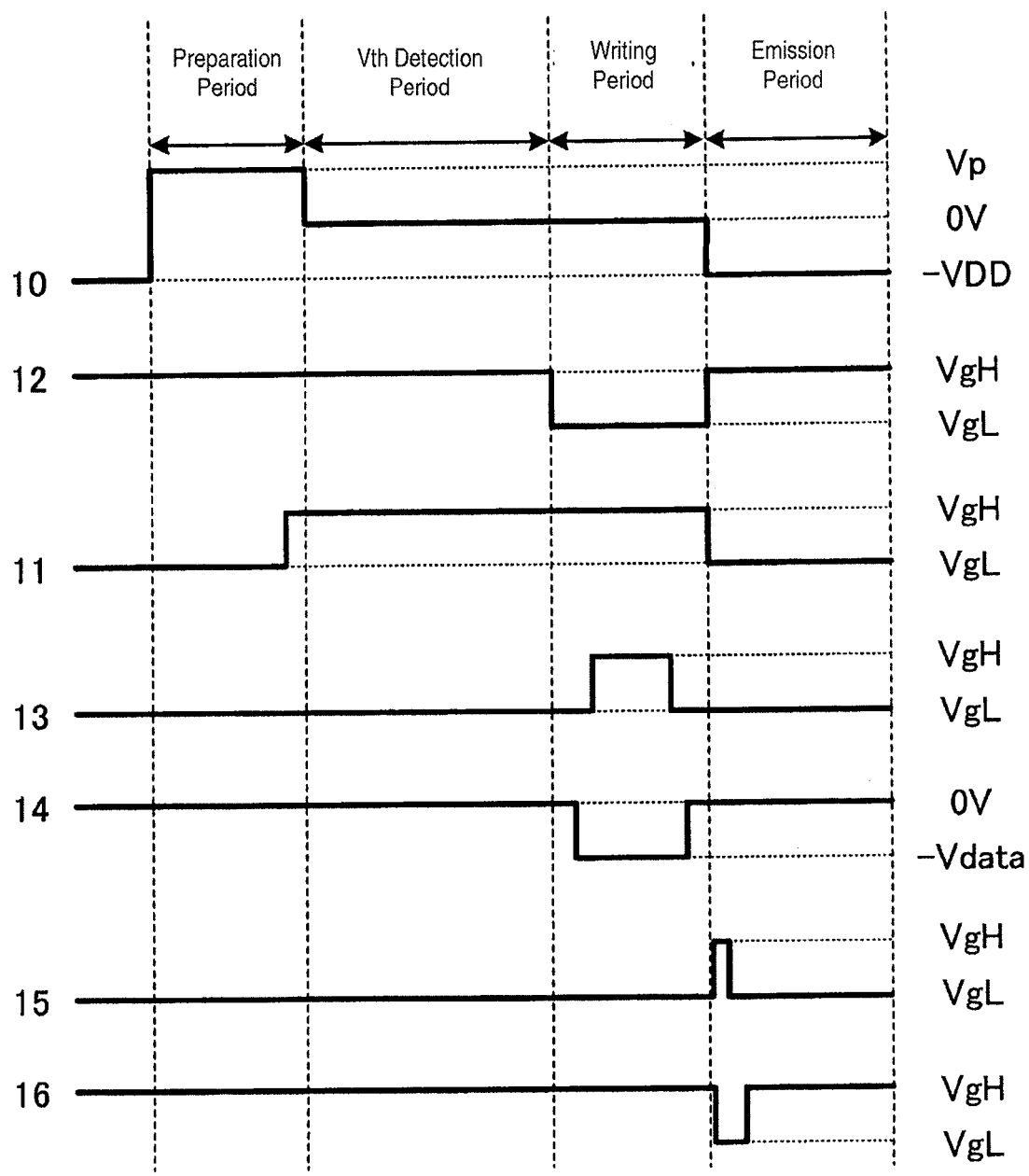
FIG. 15 is a sequence diagram showing the operations of the pixel circuit shown in FIG. 14.

Next, the operations of the pixel circuit shown in FIG. 14 are explained with reference to FIGS. 14 and 15. FIG. 15 is a sequence diagram showing the operations of the pixel circuit shown in FIG. 14.

In FIG. 15, the operations during the preparation, $V_{th}$ detection, and writing periods are the same as the sequence diagram shown in FIG. 3. The explanation of those operations is omitted. During the light emission period, the first $V_{oled}$ control line 15 is set to a high gate potential ($V_{gH}$) in order to electrically connect the pair of transistors in the detecting circuit 21 to each other. On the other hand, the second $V_{oled}$ control line 16 is set to a low gate potential ($V_{gL}$) to electrically disconnect the pair of transistors in the feedback circuit 25 to each other. After that, when the organic light emitting element OLED emits light, the additional capacitor stores an electric charge corresponding to a voltage $V_{oled}$ which is applied between both ends of the organic light emitting element OLED. As a result, the voltage storage circuit 23 stores a voltage corresponding to the voltage $V_{oled}$. Next, the first $V_{oled}$ control line 15 is set to a low gate potential ($V_{gL}$) and the second $V_{oled}$ control line 16 is set to a high gate potential ($V_{gH}$). Thus, the voltage $V_{oled}$ stored in the additional capacitor $C_{add}$ is added to the image signal potential already written to the storage capacitor $C_s$, and thereby the control technique on a basis of the equation (8) is performed. Note that the proportional constant 'b' in equation (8) is determined by the capacitance ratio which is the ratio of total capacitance of the capacitors (for example, parasitic capacitance of the driving transistor $T_d$) electrically connected to the gate or source of the driving transistor $T_d$ vs. the capacitance of the additional capacitor $C_{add}$. Therefore, the desired proportional constant can be determined by adequately adjusting the capacitance of the additional capacitor. For example, in this embodiment, the proportional constant 'b' is 0.43 as shown in FIG. 12.

As described above, the image display apparatus according to this embodiment enables the individual pixel circuit to detect the change of the applied voltage to the organic light emitting element OLED and to apply a voltage corresponding to the detected voltage to the driving element to feed back the detected result to the pixel circuit. Therefore, external circuits can have simple structures. The luminance change of the organic light emitting element OLED can be compensated with less influenced by the characteristics fluctuation of the driving transistors. The act of detecting the applied voltage to the organic light emitting element OLED and the act of applying the detected applied voltage to the organic light emitting element OLED are performed in the same frame, and thereby the luminance of the organic light emitting element OLED can be more appropriately compensated. It is preferable to perform the detection and the compensation in each frame.

Figure 18:
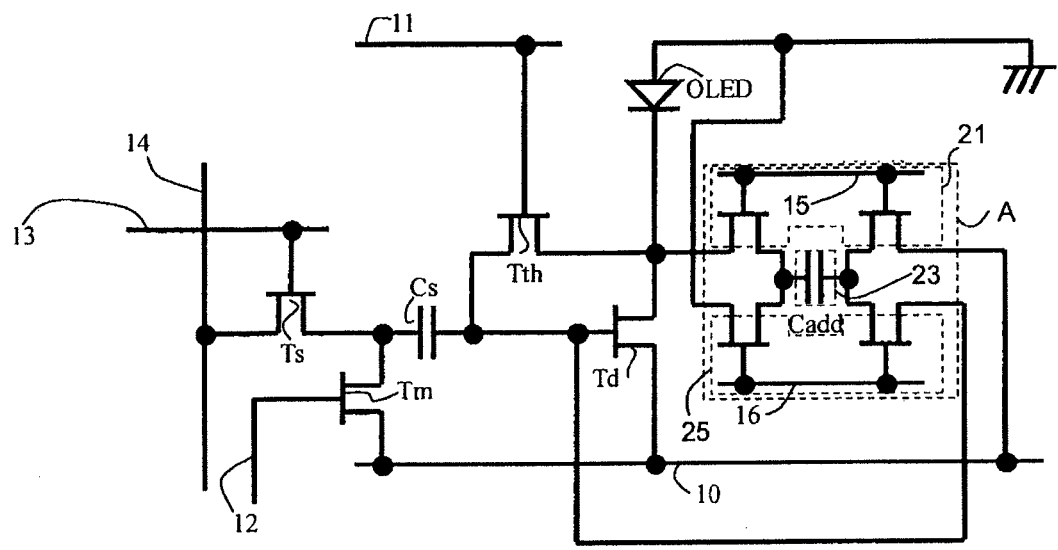
FIG. 18 is a diagram showing an image display apparatus in accordance with another embodiment of the invention and shows an exemplary pixel circuit corresponding to one pixel in the image display apparatus.

As clearly understood by the circuit structure in FIG. 1 etc., since the sum of the voltage $V_{oled}$ of both ends of the organic light emitting element OLED and the voltage $V_{ds}$ between the drain and the source of the driving transistor Td is substantially constant, the change of the voltage $V_{oled}$ may be detected as the an equivalent change of the voltage $V_{ds}$ of the driving transistor to the change of the voltage $V_{oled}$, and then the driving transistor $T_d$ may be controlled by the detected equivalent change of the voltage $V_{ds}$. In this embodiment, the first and second terminals of the detecting circuit 21 may be connected to the drain and the source of the driving transistor $T_d$, respectively. For example, as shown in FIG. 18, the detecting circuit 21 may be connected to the drain and the source of the driving transistor $T_d$ and the feedback circuit 25 may be connected to the gate of the driving transistor $T_d$ and the anode of the organic light emitting element OLED. The pixel circuit in FIG. 18 can be driven on a basis of the same sequence as FIGS. 15 and 16. Alternatively, the feedback circuit 25 may be connected to the gate of the driving transistor $T_d$ and the cathode of the organic light emitting element OLED (or the drain of the driving transistor $T_d$). However, it is preferable to connect the first terminal of the feedback circuit 25 to the anode of the organic light emitting element OLED and the feedback circuit 25 is connected to the gate and the drain of the driving transistor $T_d$ through the organic light emitting element OLED. This is because the luminance of the organic light emitting element OLED is directly adjusted and the compensation for the luminance is easier.

Figure 16:
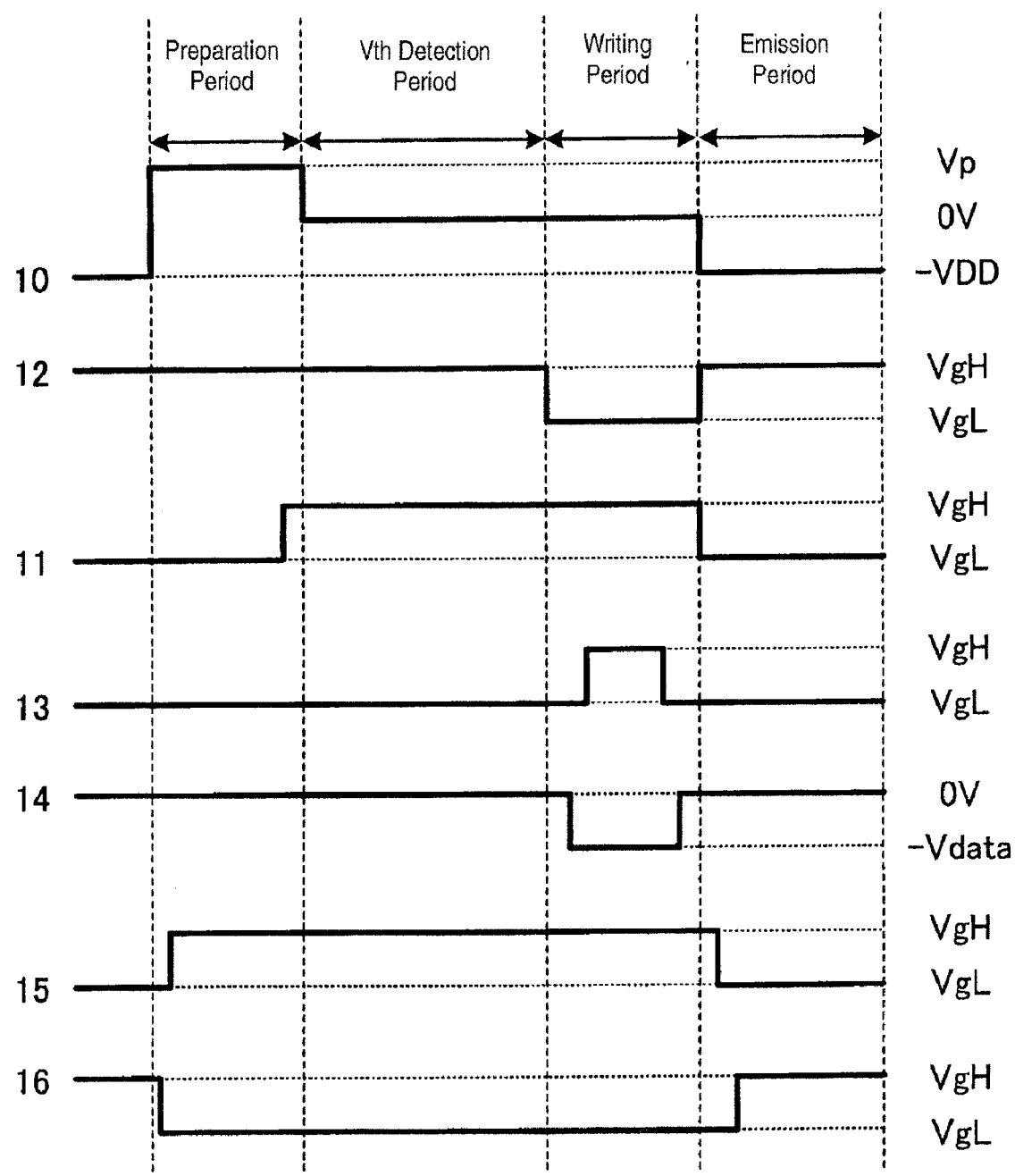
FIG. 16 is another sequence diagram showing the operations of the pixel circuit shown in FIG. 14.

FIG. 16 is another sequence diagram different from the sequence in FIG. 15. In the sequence shown in FIG. 16, the first $V_{oled}$ control line 15 is set to a high gate potential ($V_{gH}$) and the second $V_{oled}$ control line 16 is set to a low gate potential ($V_{gL}$) during the preparation period. Even when the first $V_{oled}$ control line 15 is set to a high gate potential ($V_{gH}$), there is no problem since the stored voltage in the additional capacitor $C_{add}$ is not applied between the gate and the source of the driving transistor $T_d$ so long as the second $V_{oled}$ control line 16 is set to the low gate potential ($V_{gL}$). In particular, when a longer emission period is desired in the sequence in FIG. 15, the detection period for the both ends voltage of the organic light emitting element OLED may be too short to store the electric charge to the additional capacitor $C_{add}$. On the other hand, in the sequence of FIG. 16, a longer detection period can be obtained. Although the timing to switch the potential of the first $V_{oled}$ control line 15 from a low gate potential ($V_{gL}$) to a high gate potential ($V_{gH}$) and the timing to switch the potential of the second $V_{oled}$ control line 16 from a high gate potential ($V_{gH}$) to a low gate potential ($V_{gL}$) is during the preparation period in FIG. 16, those timings may be during the $V_{th}$ detection period or the writing period.

In this embodiment, it is preferable that each of the channel widths $W_{21}$ and $W_{25}$ of the thin-film transistors in the detecting circuit 21 and the feedback circuit 25 be smaller than the channel width $W_{Td}$ of the driving transistor Td. In this case, the space for the control circuit A can be smaller. Note that since the current flowing through the detecting circuit 21 or the feedback circuit 25 is smaller than the current flowing through the driving transistor Td, the smaller channel widths of detecting circuit 21 and the feedback circuit 25 than the channel width of the driving transistor Td has no major problem. In view of smaller space for the control circuit A, it is preferable that each of the channel widths $W_{21}$ and $W_{25}$ of the thin-film transistors in the detecting circuit 21 and the feedback circuit 25 be smaller than each of the channel widths $W_{Ts}$, $W_{Tm}$ and $W_{Tk}$ of the threshold voltage detecting transistor and switching transistors $T_s$, $T_m$ and $T_k$.

It is preferable that the capacitance of the additional capacitor $C_{add}$ in the voltage storage circuit 23 be smaller than the capacitance of the storage capacitor $C_s$ connected to the driving transistor $T_d$. This is because a larger capacitance of the additional capacitor reduces the writing efficiency which is the change of voltage ($V_{gs}-V_{th}$) to the change of voltage of the image signal line.

The transistors in the control circuit A can be formed in a different layer from a layer in which the driving transistor $T_d$ and the switching transistors $T_s$, $T_m$ and $T_k$ are formed. As a result, the control circuit A can be formed within the pixel area.

Figure 17:
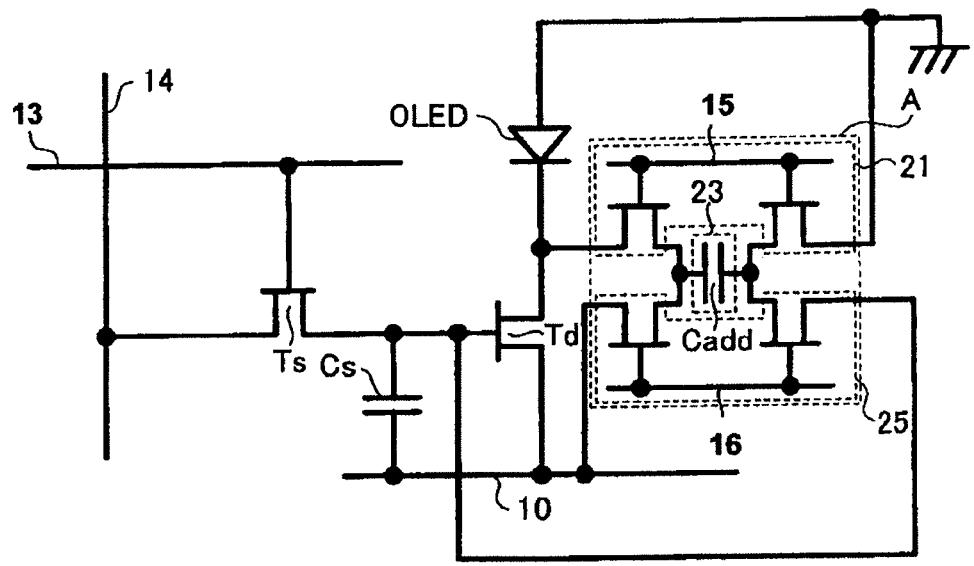
FIG. 17 is a diagram showing an image display apparatus in accordance with another embodiment of the invention and shows an exemplary pixel circuit corresponding to one pixel in the image display apparatus.

In the above-described embodiments, the invention applies to the pixel circuit including the threshold voltage detecting transistor $T_{th}$ for detecting the threshold voltage $V_{th}$ of the driving transistor. However, the invention can apply to a pixel circuit not including the threshold voltage detecting transistor $T_{th}$ as shown in FIG. 17.

The above-described explanation is related to a pixel circuit corresponding to one pixel in the image display apparatus, but may apply to the image display apparatus related to the multi-color display having picture elements, each of which includes three primary color pixels consisting of red, green, and blue pixels. In this case, the capacitance ratios for each color pixel, which are ratios of total capacitance values of capacitors connected to between the gate and source of the driving transistor $T_d$ vs. the capacitance value of the additional capacitor $C_{add}$, can be different from one another. Therefore, setting the appropriate capacitance ratio for each color pixel enables the each color pixel to compensate for the luminance with the smaller characteristic fluctuation of the driving transistor.

In this embodiment, an organic light emitting element is used as the light emitting element, however other types of light emitting elements, such as an inorganic LED can be used as the light emitting element.

The invention claimed is:

1. An image display apparatus comprising:
   a plurality of pixels circuits, each pixel circuit including
      a light emitting element operable to emit light while current passes there through;
      a driver configured to control light emission of the light emitting element, the driver being electrically connected to the light emitting element;
      a control circuit electrically connected to the light emitting element and driver; and
      a first capacitor electrically connected to the driver for storing a data voltage;
   wherein the control circuit detects a voltage applied to the light emitting element and the detected voltage is fed back to the driver at least while the light emitting element is emitting light in a frame,
   wherein the control circuit includes a second capacitor for storing the detected voltage applied to the light emitting element, the second capacitor having a smaller capacitance than the first capacitor, and
   wherein an electrical charge in the second capacitor is discharged to be supplied to the first capacitor while the light emitting element is emitting light in the frame.

2. An image display apparatus according to claim 1, wherein the control circuit comprises
   a detecting unit for detecting the voltage applied to the light emitting element at least while the light emitting element is emitting light;
   a voltage storage unit comprising the second capacitor for storing the detected voltage which is detected by the detecting unit; and
   a feedback unit for applying a voltage to the driver at least while the light emitting element is emitting light, the voltage being corresponding to the detected voltage which is stored in the voltage storage unit.

3. An image display apparatus according to claim 2, wherein the act of detecting the applied voltage to the light emitting element by the detecting unit and the act of applying the corresponding voltage and the stored voltage to the driver by the feedback unit occur in the frame.

4. An image display apparatus according to claim 2, wherein the feedback unit applies a voltage to the driver, the voltage corresponding to a capacitance value of the second capacitor in the voltage storage unit.

5. An image display apparatus according to claim 1, wherein each of the pixel circuits further comprises a threshold voltage detecting unit for detecting a threshold voltage of the driver.

6. An image display apparatus according to claim 2, wherein the detecting unit is electrically connected to both ends of the light emitting element.

7. An image display apparatus according to claim 2, wherein the driver comprises a thin film transistor.

8. An image display apparatus according to claim 7, wherein the detecting unit is electrically connected to a source and a drain of the driver.

9. An image display apparatus according to claim 7, wherein the feedback unit is electrically connected to a gate and a source of the driver or to a gate and a drain of the driver.

10. An image display apparatus according to claim 7, wherein the voltage storage unit is electrically connected to both the detecting unit and the feedback unit.

11. An image display apparatus according to claim 7, wherein each of the detecting unit and the feedback unit comprises a thin film transistor, and has a smaller channel width than the driver.

* * * * *